(12) United States Patent
Wilson

(10) Patent No.: US 11,346,874 B2
(45) Date of Patent: May 31, 2022

(54) CONTROLLING POWER DISTRIBUTION DEVICES USING WEARABLE VOLTAGE DETECTION DEVICES

(71) Applicant: Schweitzer Engineering Laboratories, Inc., Pullman, WA (US)

(72) Inventor: Christopher Michael Wilson, Land O Lakes, FL (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 163 days.

(21) Appl. No.: 16/858,886

(22) Filed: Apr. 27, 2020

(65) Prior Publication Data

US 2021/0333312 A1 Oct. 28, 2021

(51) Int. Cl.
*G01R 29/08* (2006.01)
*G01R 19/145* (2006.01)
*G08B 21/18* (2006.01)

(52) U.S. Cl.
CPC ....... *G01R 29/0857* (2013.01); *G01R 19/145* (2013.01); *G08B 21/182* (2013.01)

(58) Field of Classification Search
CPC .. G01R 19/145; G01R 29/0857; G01R 19/14; G08B 21/182
See application file for complete search history.

(56) References Cited

U.S. PATENT DOCUMENTS

| | | |
|---|---|---|
| 6,788,215 B1 | 9/2004 | White |
| 8,526,156 B2 | 9/2013 | Schweitzer, III |
| 9,494,632 B1 | 11/2016 | McNulty |
| 10,147,234 B2 | 12/2018 | Bare |
| 2010/0330952 A1* | 12/2010 | Yeoman ............ H04M 1/72424 455/404.2 |
| 2016/0147209 A1* | 5/2016 | Stoupis .................. G01R 31/40 700/295 |
| 2017/0205454 A1* | 7/2017 | Rachakonda ........ G01R 29/085 |
| 2019/0149715 A1* | 5/2019 | Kraeling ................ G08B 21/02 348/148 |

* cited by examiner

*Primary Examiner* — Omeed Alizada
(74) *Attorney, Agent, or Firm* — Fletcher Yoder, P.C.

(57) ABSTRACT

A system may include a device that controls power to an electrical component of an electrical power distribution system. The system may also include a voltage detection device that may detect a presence of a voltage within a distance. The system may further include a control system that may receive location information via a receiver communicatively coupled to the control system, and adjust more operations of the device based on at least in part of the location information. The location information may be transmitted by the voltage detection device in response to detecting that the presence of the voltage is within the distance. The location information may correspond to the electrical component.

20 Claims, 4 Drawing Sheets

CONTROLLING POWER DISTRIBUTION DEVICES USING WEARABLE VOLTAGE DETECTION DEVICES

BACKGROUND

This disclosure relates to systems and methods for providing electrical workers with improved safety protection. More particularly, the subject matter is related to systems and methods for providing electrical workers, such as power line workers, with safety protection while working with energized power lines.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

Electrical workers are qualified technicians who have skills and knowledge related to construction, installation, and operation of electrical equipment that conduct, control, convert, distribute, generate, measure, rectify, store, transform, or transmit electrical energy. During manufacturing test, installation, and operation of electrical equipment, the electrical workers may perform live-line working involving maintenance of the electrical equipment operating at high voltage (e.g., greater than 1000V) while the electrical equipment is energized. Live-line maintenance techniques are used in the electric power distribution industry to perform periodic maintenance on transmission lines and other electrical equipment while avoiding the power disruption and excessive costs related to power outage.

In some cases, it may be beneficial to provide additional guidance to the electrical workers to better determine whether an electrical equipment is energized during certain maintenance. Safety equipment, such as insulating gloves or rubber gloves, may provide certain protections during the live-line maintenance. However, at high voltages, the electrical workers may be at risk of being exposed to electrical voltages and currents even without direct contact with energized equipment. For instance, an electric arc may jump from the energized equipment to a conductor or grounding point.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In a first embodiment, a system may include a device that controls power to an electrical component of an electrical power distribution system. The system may also include a voltage detection device that may detect a presence of a voltage within a distance. The system may further include a control system that may receive location information via a receiver communicatively coupled to the control system, and adjust more operations of the device based on at least in part of the location information, whereby the location information is transmitted by the voltage detection device in response to detecting that the presence of the voltage is within the distance and corresponds to the electrical component.

In a second embodiment, a non-transitory computer-readable medium stores computer-executable instructions that when executed by at least one processor, may cause the at least one processor to receive location information from a voltage detection device, whereby the location information corresponds to a location of the voltage detection device that detected a presence of the voltage is within a distance, and whereby the location corresponds to an electrical component of an electrical power distribution system. The instructions, when executed by the at least one processor, may also cause the at least one processor to adjust one or more operations of a device that controls power to the electrical component in response to the location information indicative of being within the distance of the electrical component.

In a third embodiment, a method is provided. The method may include receiving, via a processor, information indicative a presence of a voltage greater than a threshold within a distance of a voltage detection device. The method may include acquiring, via the processor, location information associated with the voltage detection device. The method may also include transmitting, via the processor, the location information to a power control system associated with the location information. The method may also include generating, via the processor, one or more alerts associated with the presence of the voltage. The method may further include receiving, via the processor, a power line status information from the power control system. Additionally, the method may include presenting, via the processor, the one or more alerts and the power line status via one or more visualizations depicted on a display, one or more haptic outputs, one or more audio outputs, or any combination thereof.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
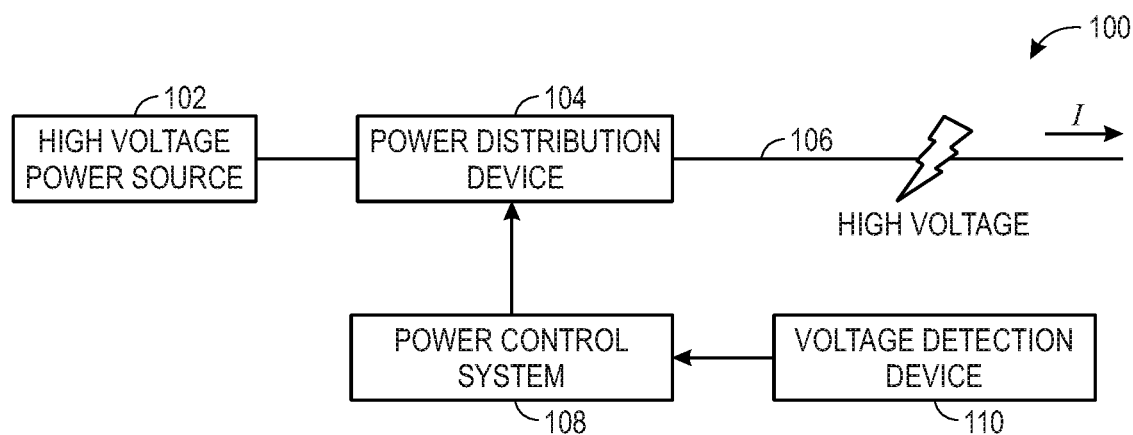
FIG. 1 illustrates a preventive power line control system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

Protective devices, such as certain electronic devices that can detect and/or monitor high voltage (e.g., by detecting high current), may provide safety protections for electrical workers who work on energized electrical equipment during live-line maintenance. Such protective devices may provide visual and/or auditory indications (e.g., flashing light, warning message/sound, and the like) in response to detecting energized equipment. Some of the protective devices may provide location information (e.g., based on GPS operation) that may be transmittable to other relevant devices. In some embodiments, high voltage detecting/monitoring devices may be integrated with power control devices (e.g., a recloser or protective relay) to provide a preventive mechanism that helps protecting the electrical workers who may inadvertently contact energized lines or other equipment.

With this in mind, a wearable voltage detection device, as described in present disclosure, may automatically detect a high voltage source (e.g., an energized transmission line) that may be present within a certain range or distance of the wearable voltage detection device. After detecting the high voltage presence, the wearable voltage detection device may wirelessly transmit information (e.g., location information) regarding the detected high voltage source to one or more receivers within a transmission range. The receivers may be communicatively connected to power control devices (e.g., reclosers or relays) associated with the high voltage source (e.g., feeder lines). Based on the detected high voltage information, certain settings (e.g., pickup and time dial settings) of the power control devices may be automatically modified to improve safety for the electrical workers who are within the range of the high voltage source detected by the wearable voltage detection devices.

The embodiments of the present disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, for the sake of brevity and clarity, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein may be arranged and designed in a wide variety of different configurations.

With the forgoing in mind, turning now to the figures, FIG. 1 illustrates a preventive power line control system 100. A high voltage power source 102 (e.g., a high voltage transformer in a power transmission substation) provides electrical power through a variety of power distribution devices 104 (e.g., transformers, regulators, rectifiers, circuit breakers, switchgear, and the like) and power distribution line(s) 106. A power control system 108 may control operations of the power distribution devices 104. The power control system 108 may include any suitable device that controls the output power. For example, the power control system 108 may control the power distribution devices 104, which may include a circuit breaker, a switch, a recloser, a drive, or the like. In some embodiments, the power control system 108 may receive information from a voltage detection device 110. The voltage detection device 110 may include a voltage detector that can detect a presence of high voltage on the power distribution line 106 within a certain distance. The voltage detection device 110 may also include a transmitter that may send a signal indicating the presence of high voltage (e.g., voltage above a threshold) to the power control system 108. Based on at least in part of the received signal indicating the presence of high voltage, the power control system 108 may automatically modify certain power control settings of the power distribution devices 104 to change behaviors of a power system (e.g., a power delivery system) and reduce the risk of certain hazards (e.g., electrical shock). The changed behaviors of the power system may include electrical system reconfiguration and/or more expedient tripping of electrical isolation devices by way of modifying the protective relaying set points or isolating device set points to reduce the risks to the electrical worker who is wearing the voltage detection device 110 during the live-line maintenance.

For example, when a signal indicating an existence of detected high voltage is transmitted (e.g., via wireless communications) from the voltage detection device 110 to the power control system 108. The power control system 108 may cause the power distribution devices 104 to modify certain power control settings, such as pickup points and time-dial settings of a relay nearest the detected high voltage. Such control setting modifications may cause the power distribution devices 104 to perform certain protective functions in response to the detection of high voltage. In other words, in the case of the presence of high voltage being detected by the voltage detection device 110, the power control system 108 may be notified and may control the power distribution devices 104 (e.g., circuit breaker, switch, recloser, relay, or the like) to make preventive operations to stop, close, suspend, restart, or reset the upstream power transmission to the power distribution line 106 where the high voltage is detected by the voltage detection device 110. In another example, adjusting the trip setting of the power distribution devices 104 may enable the power distribution devices 104 to operation or react (e.g., faster tripping) more quickly and better protect the electrical worker who may inadvertently contact a nearby energized line.

Figure 2:
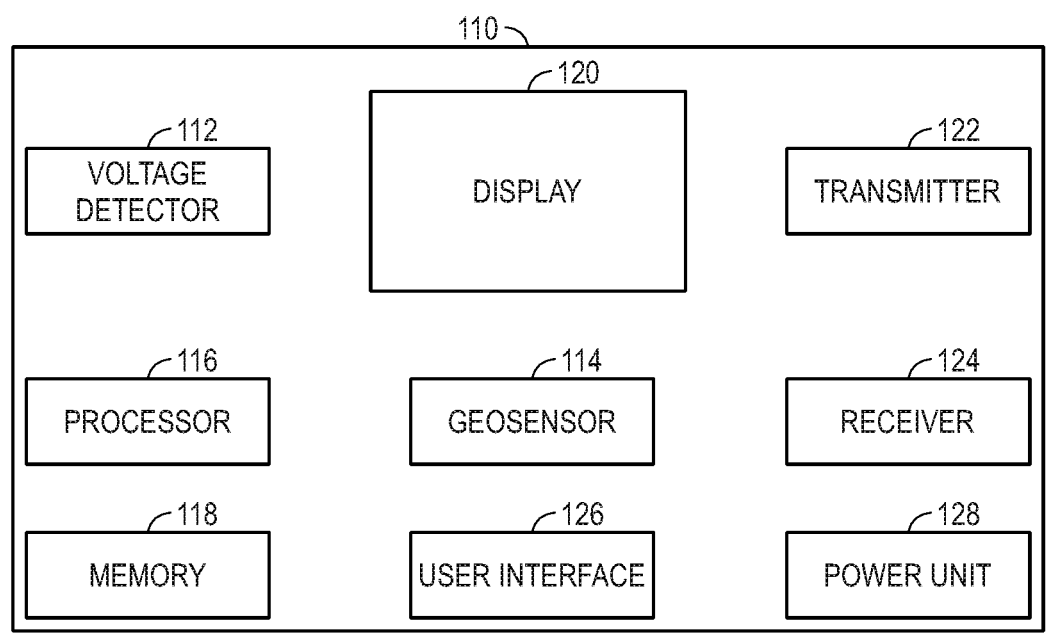
FIG. 2 depicts a block diagram of components that may be part of a voltage detection device, in accordance with an embodiment.

Turning to FIG. 2, a block diagram of components that may be part of the voltage detection device 110. The voltage detection device 110 may include a voltage detector 112 that is configured to detect a high voltage or a voltage above some threshold that is present within a certain range (e.g., 10-12 feet). High voltage detection may use equipment or components that detect high electrical current (e.g., above a specified threshold current), for example, based on an electro-magnetic field measurement using induced current or the like.

The voltage detection device 110 may include a geosensor 114. For example, the geosensor 114 may be any type of location sensor that detects a current location of the voltage detection device 110. The detected location information may include latitude, longitude, accuracy, altitude, speed and heading (or direction), and the like. In some embodiments, the geosensor 114 may be a global positioning system (GPS) sensor.

Further, the voltage detection device 110 may include a processor 116 and a memory 118. The memory 118 may contain instructions for the execution of the high voltage detection, the location detection, and relevant calculations that are to be done by the processor(s) 116. The processor(s) 116 may control the execution of the instructions that are stored in the memory 118, and the detections and calculations that are performed may be sent, via certain wireless communication circuitry and a transmitter 122, to nearby receivers that may be communicatively connected to the power control system 108. These articles of manufacture may represent computer-readable media (i.e., any suitable form of memory or storage) that may store the processor-executable code used by the processor 116 to perform the presently disclosed techniques.

The voltage detection device 110 may provide visual, vibrational, and/or auditory displays/indications/alerts. The indications or alerts may be representative of a location of an electrical worker, detected high voltage distance/orientation with respect to the electrical worker, indications of certain preventive actions that have been performed or to be performed (e.g., blocking reclosing), recommendations for the electrical worker to implement to reduce distance to high voltage, and the like. A display 120 may be used to provide the visual indications and/or alerts, a vibrator may be used to provide the vibrational indications and/or alerts, and a speaker may be used to provide the audio indications and/or alerts.

In some embodiment, a receiver 124 may be included in the voltage detection device 110. The receiver 124 may receive information (e.g., location of a detected high voltage by other voltage detection devices worn by other electrical workers) that may be helpful for coordinated power line maintenance work. The receiver 124 may also receive information from nearby power control systems 108. Such information may be related to the latest status of the power distribution system after certain preventive actions (e.g., blocking and reclosing) have been performed in response to the detection of the high voltage.

In some embodiments, a portable communication device (e.g., a smart phone) may be connected to the voltage detection device 110, which may interface with nearby receivers communicatively connected to the power control system 108 to provide additional location information. In other embodiment, short-range wireless communication devices (e.g., WiFi or Bluetooth devices) may also be connected to the voltage detection device 110, which may provide beacons for location information. It should be noted that, in some embodiments, the voltage detection device 110 may be integrated into another computing device, such as a mobile phone.

In certain embodiments, the voltage detection device 110 may provide a user interface 126 that allows the electrical worker to view received information from the voltage detector 112, the geosensor 114, and the receiver 124. The user interface 126 may also allow the electrical worker to input certain information (e.g., work status) that may be broadcasted to nearby receivers of the other voltage detection devices.

A power unit 128 is included in the voltage detection device 110. The power unit 128 may provide electrical power for the voltage detection device 110 to function. In certain embodiments, the power unit 128 may include an energy harvesting mechanism to collect power through inductance or some other suitable energy harvesting tool. For example, energized power lines with alternating currents produce a time-varying magnetic field along with a time-varying electric field. By way of inductance, the power unit 128 may extract energy from the alternating magnetic field and/or electrical field (e.g., from the detected high voltage). In some embodiments, the energy acquired by the inductance may be used to provide power to at least a portion of the circuitry of the voltage detection device 110. The power unit 128 may store the energy extracted from the alternating magnetic/electrical field in an energy storage component. In some embodiments, the power unit 128 may include a battery.

Figure 3:
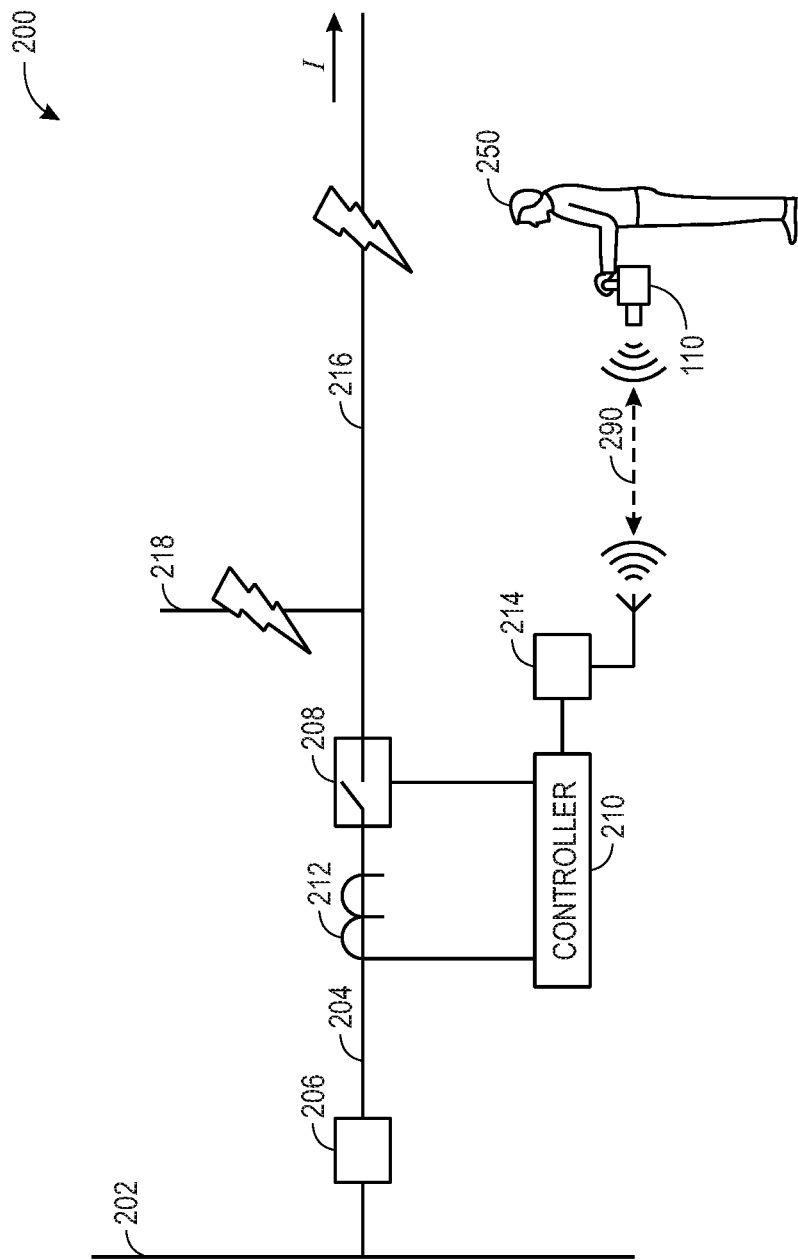
FIG. 3 illustrates a diagram of an electric power distribution system that may use the preventive power line control system of FIG. 1, in accordance with an embodiment.

With the preceding in mind, and to provide further familiarity with principle of preventive power line control, FIG. 3 illustrates a diagram of an electric power distribution system 200 that may use the methodology described above with reference to the preventive power line control system 100 of FIG. 1. Referring to FIG. 3, a bus 202 may provide electric power to a feeder line 204, which, in turn, may provide electric power to a line 216 and at least one branch line 218. For example, the feeder line 204 may be a type of transmission line that transmits power from power generating station or substation to distribution points. The feeder line 204 may include a circuit breaker 206.

The illustrated electric power distribution system 200 may include a power device 208 (e.g., a relay or a recloser), a power device controller 210 (e.g., an Intelligent Electronic Device), a current transformer 212, and a receiver 214. The power device 208 may include an electro-mechanical protective relay or a digital protective relay for the detection of electrical faults. The power device controller 210 may be a type of Intelligent Electronic Device that serves as a microprocessor-based controller for power control devices, such as circuit breakers, relays, reclosers, transformers, and capacitor banks. The power device controller 210 may include software-based protective algorithms (e.g., stored in a memory and may monitor the electric power distribution system 200 by receiving power system information from the feeder line 204 using, for example, the current transformer 212. The power device controller 210 may also control operations of the power device 208. Operations of the power device 208 may include stopping, closing, suspending, restarting, or resetting the power transmission upstream to the power distribution lines 216 and 218. As such, the power device controller 210 corresponds to the description of the power control system 108 and the power device 208 corresponds to the description of the power distribution devices 104 mentioned above.

As mentioned in preceding sections, an electrical worker 250 may perform live-line maintenance work near an energized line (e.g., the line 216 or the branch line 218), which is associated with a high voltage (e.g., greater than 1000V). In some embodiments, the electrical worker 250 may wear the voltage detection device 110, which may detect a presence of a high voltage or a voltage above some threshold (e.g., 1000V) within a certain range (e.g., 10-12 feet). The voltage detection device 110 may be equipped with the transmitter 122 (e.g., a radio frequency transmitter) that is capable of transmitting information (e.g. location) related to the detected high voltage to the receiver 214, which may be capable of receiving communication signals from the voltage detection device 110 with a range 290 (e.g., 4 miles) of the transmitter 122.

The voltage detection device 110 may acquire the location information (e.g., via a global position system sensor) or receive the location information from another device/system (e.g., a smart phone or a local position system) that is communicatively linked to the voltage detection device 110. One or more receivers (e.g., the receiver 214) within the range 290 (e.g., 4 miles from the transmitter) may be communicatively connected to the power device controller 210 and may receive the detected high voltage information from the voltage detection device 110. Using the detected high voltage information (e.g., location) and the information from the current transformer 212, the power device controller 210 may make certain protection decisions. Such protection decisions may include, for example, causing a recloser to open in response to determining that the electrical worker 250 may be within a certain distance of a high voltage.

In some embodiments, based on at least in part of the detected high voltage information (e.g., location), certain settings (e.g., pickup and time dial settings) of the power device 208 may be automatically modified to reduce the voltage that may be in the presence of the electrical worker 250 wearing the voltage detection device 110. For example, after receiving an indication that the voltage detection device 110 detects the presence of a high voltage, the power device controller 210 may adjust a setting of the power device 208 to reduce the time that the power device 208 may take for tripping to better protect the electrical worker 250 if the worker inadvertently contacts a conductor with the high voltage.

Figure 4:
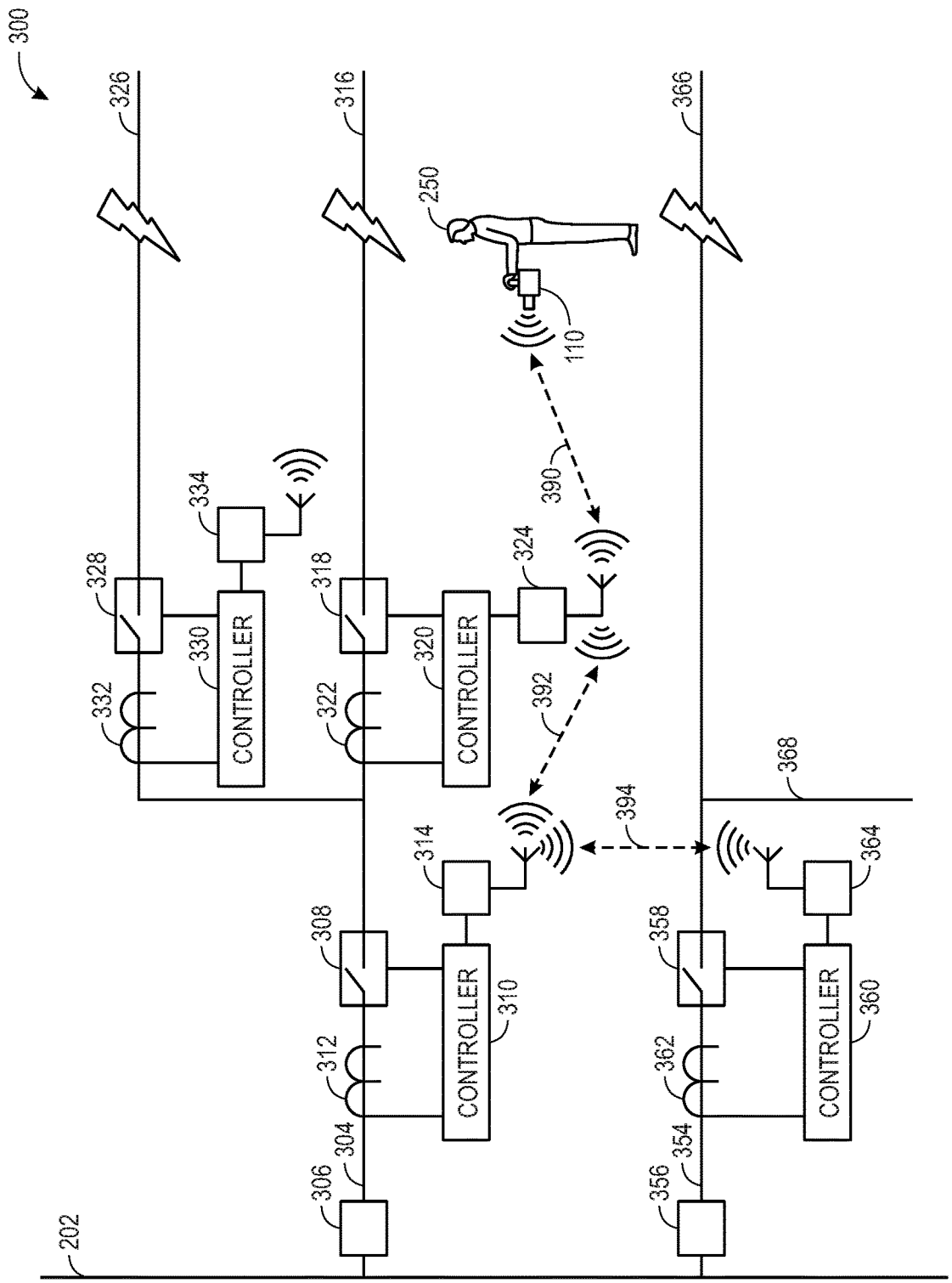
FIG. 4 illustrates a diagram of another electric power distribution system that may use the preventive power line control system of FIG. 1, in accordance with an embodiment.

With the preceding in mind, in certain embodiments, and as illustrated in FIG. 4, another electric power distribution system 300 with a multiple power distribution lines may also use the preventive power line control system 100 of FIG. 1. The bus 202, in the illustrated embodiment, may provide electric power to a first feeder line 304, which in turn provides electric power to a first line 316 and at least one branch line 326. The bus 202 may further provide electric power to a second feeder line 354, which in turn provides electric power to a second line 366 and at least one branch line 368.

The first feeder line 304 may include a circuit breaker 306, a power device 308, a power device controller 310, a current transformer 312, and a receiver 314. The first line 316 may include a power device 318, a power device controller 320, a current transformer 322, and a receiver 324. Similarly, the branch line 326 may include a power device 328, a power device controller 330, a current transformer 332, and a receiver 334. The power device 308, 318, and 328 correspond to the description of the power distribution devices 104 and the power device controller 310, 320, and 330 correspond to the description of the power control system 108 mentioned above.

The second feeder line 354 may include a circuit breaker 356, a power device 358, a power device controller 360, a current transformer 362, and a receiver 364. The power device 358 corresponds to the description of the power distribution devices 104 and the power device controller 360 corresponds to the description of the power control system 108 mentioned above. In present embodiment, no power device is located on the second line 366 and the branch line 368. In some cases, there are power devices located on the second line 366 and the branch line 368. However, these power devices may be temporarily offline (e.g., due to maintenance or malfunction) when electrical workers are working on the second line 366 or the branch line 368.

When performing the live-line maintenance, the electrical worker 250 may work near a power distribution line. The voltage detection device 110, which is worn by the electrical worker 250, may detect the presence of high voltage within a certain range (e.g., 10-12 feet). The voltage detection device 110 may transmit, via a transmitter (e.g., a radio frequency transmitter), the detected high voltage information (e.g. location) to one or more receivers (e.g., receivers 324 and 334) within a range 390 of the transmitter. As described previously, based on at least in part of the detected high voltage information (e.g., location), certain settings (e.g., pickup and time dial settings) of a corresponding power device (e.g. a recloser), which may control the power transmission positioned upstream to the detected high voltage, may be automatically modified to better protect the electrical worker 250 that may be within the range of the high voltage detected by the voltage detection device 110.

For example, the power line work 250 may be within a threshold distance of the first line 316 having a high voltage during a field operation. A signal including the location information of the high voltage being detected may be transmitted to the receivers 324 and 334, which are within the range 390 of the transmitter in the voltage detection device 110. Based on at least in part of the detected high voltage information (e.g., location), the power device controller 320 may automatically modify certain settings (such as pickup and time dial settings) of the power device 318. In comparison to the power device controller 320, the power device controller 330 may also receive the detected high voltage information via the receiver 334. However, based on at least the location information of the high voltage being detected, the power device controller 330 may determine that no action is to be taken, as the detected high voltage is not located on the branch line 326 controlled by the power device controller 330.

Additionally, or alternatively, the receivers (e.g., receiver 324) receiving the detected high voltage information may re-transmit the detected high voltage information to nearby receivers (e.g., receiver 314) within a specific range 392, which may be different to the range 390 (e.g., the range 392 may be greater than the range 390). As such, the receiver 324 that may be coupled to the power device controller 320 may be more powerful and thus may reach further distances to receive data. In addition, the nearby receivers (e.g., receiver 314) may further re-transmit the received high voltage information to their neighboring receivers (e.g., receiver 364) with a specific range 394 that may be similar to or different from the range 392.

For example, the electrical worker 250 may move to a different location that is within a range of a high voltage detected by the voltage detection device 110 on the second line 366. As illustrated in FIG. 4, the receiver 324 is not positioned upstream to the high voltage present on the second line 366. That is, the receiver 364, which is coupled to the power device controller 360, is not located within the range 390 of the transmitter in the voltage detection device 110, such that the power device 358 can be adjusted. With the re-transmission capabilities of the receivers 324 and 314, the detected high voltage information may be transferred from the transmitter of the voltage detection device 110 to the receiver 364 via the receiver 324 and the receiver 314. Based on at least in part of the detected high voltage information (e.g., location), the power device controller 360 may automatically modify certain settings (e.g., pickup and time dial settings) of the power device 358 to provide better protection for the electrical worker 250 who is within a range of the high voltage detected by the voltage detection device 110. Such methods may provide enhanced safety protection for the electrical workers in areas where sparse receiver coverage may be encountered.

Figure 5:
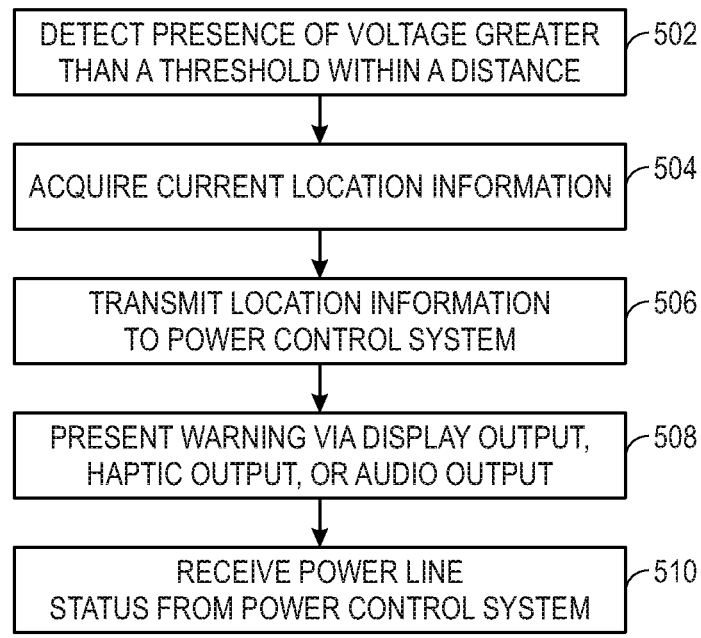
FIG. 5 is a flow diagram of a method for detecting a presence of high voltage using the voltage detection device of FIG. 2, in accordance with an embodiment.

Keeping the forgoing in mind, FIG. 5 presents a flow diagram of a method that may provide high voltage detecting, locating, and broadcasting using the voltage detection device 110. When an electrical worker wearing the voltage detection device 110 is in a position within a certain range of distance (e.g., 10 to 12 feet) from an energized power line having a voltage greater than a threshold (e.g., 1000V), the voltage detection device 110 may automatically detect the presence of high voltage within a distance (block 502) using the voltage detector 112. The voltage detection device 110 may acquire current location information (block 504) associated with the detected presence of high voltage.

Next, the voltage detection device 110 may transmit location information to a power control system (block 506) using the transmitter 122. The power control system (e.g., the power control system 108) may include a receiver (e.g., the receiver 214) that can receive the transmitted location information from the voltage detection device 110. The voltage detection device 110 may present warning via display output, haptic output, or audio output (block 508), using the display 120, a speaker, or other suitable devices. For example, the detected high voltage information (location, direction, or strength) may be provided to the electrical worker via the display 410 as visual warnings, via the speaker as audio warnings, via the other suitable devices as corresponding warnings, or a combination thereof.

Further, the voltage detection device 110 may receive power line status information from the power control system (block 510) via the receiver 124. As mention previously, the power line status information may include the status of a power distribution system (e.g., the power distribution system 300) after certain preventive actions have been performed in response to the detection of high voltage. Such information may also be provided via the display 410 as visual warnings, via the speaker as audio warnings, via the other suitable devices as corresponding warnings, or a combination thereof.

Figure 6:
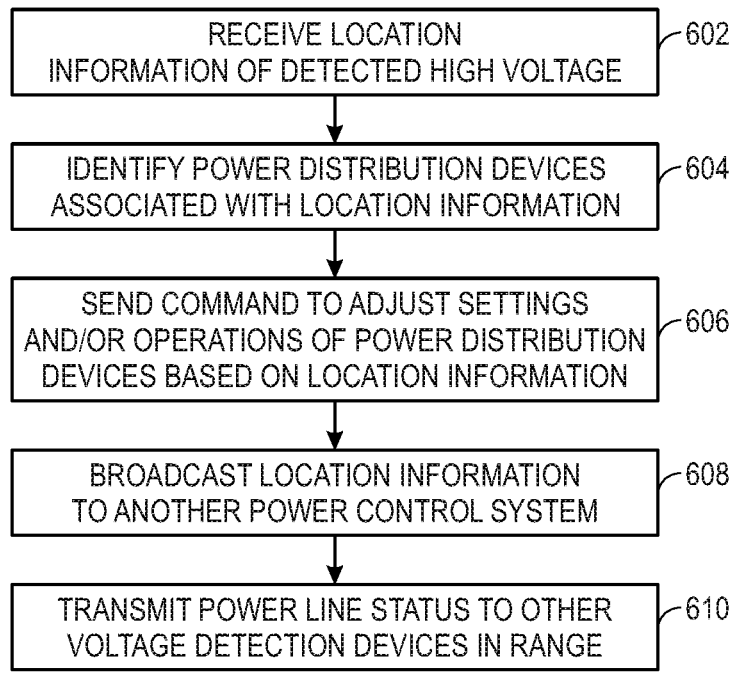
FIG. 6 is a flow diagram of a method for adjusting setting or operations of power distribution devices, in accordance with an embodiment.

As discussed previously, when a presence of high voltage is detected by the voltage detection device 110, the power control system 108 may be notified and make certain preventive operations accordingly. With this in mind, turning to FIG. 6, a flow diagram of a method employed by the power device controller 210 after receiving a signal detecting the presence of high voltage by the voltage detection device 110. The power device controller 210 may receive location information of detected high voltage (block 602) via a receiver (e.g., receiver 214). Based on at least in part of the detected high voltage location information, the power device controller 210 may use microprocessor(s) and instructions stored in a memory to identify power distribution devices (e.g., circuit breaker, switch, recloser, relay, or the like) associated with the detected high voltage location information (block 604).

The power device controller 210 may send command to adjust settings and/or operations of power distribution devices based on location information (block 606). With the adjusted settings, the identified power distribution devices associated with the detected high voltage location information may adjust operations to better protect electrical workers within a distance of the high voltage.

For example, by identifying which energized power line the detected high voltage locates on, the power device controller 210 (e.g., a recloser controller) may send commands to a recloser to adjust settings to speed up tripping and disable reclosing. As such, if the electrical worker inadvertently contacts a nearby energized line during power line maintenance, the recloser controller may receive the detection of a high voltage on the energized line from the voltage detection device 110 worn by the electrical worker within a short period of time (e.g., 6 milliseconds). Certain settings (e.g., tripping speed and reclosing permission) may be adjusted promptly so that a fast tripping may occur to open the circuit and reclosing of the circuit may be prevented to better protect the electrical worker.

In some embodiments, after the power device controller 210 sends commands to certain power distribution devices (e.g., relays of reclosers) to perform certain protective functions in response to the detection of the high voltage, the power device controller 210 may use the transmitter 122 to broadcast location information to another power control system (block 608) within a specific communication range. Such shared information may prompt the other power control systems to prepare for a potential power outage due to a tripping triggered by an accidental contact with the energized line when an electrical worker is performing live-line maintenance.

As mentioned previously, the power device controller 210 may transmit power line status to other voltage detection devices in range (block 610). Such transmitted information may increase the visibility/awareness of the latest power line status for the electrical workers.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform. Accordingly, many changes may be made to the details of the above-described embodiments without departing from the underlying principles of this disclosure. The scope of the present disclosure should, therefore, be determined only by the following claims.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A system, comprising:
a plurality of devices configured to control power to a plurality of electrical components of an electrical power distribution system;
a voltage detection device configured to detect a presence of a voltage within a distance; and
a control system configured to perform operations comprising:
receiving location information via a receiver communicatively coupled to the control system, wherein the location information is transmitted by the voltage detection device in response to detecting that the presence of the voltage is within the distance;
identifying a first set of devices of the plurality of devices based on the location information;
sending a first set of commands to the first set of devices, wherein the first set of commands is configured to adjust a first set of operations of the first set of devices to reduce the voltage; and
broadcasting the location information to a second set of devices of the plurality of devices after sending the first set of commands, wherein the second set of devices are within a communication range of the control system, wherein the second set of devices are configured to adjust a second set of operations based on the location information, and wherein the second set of devices are located a threshold distance away from the first set of devices.

2. The system of claim 1, wherein the voltage detection device is a wearable device configured to be worn by a user.

3. The system of claim 1, wherein the voltage detection device comprises a voltage detector configured to detect the presence of the voltage within the distance based on an electrical current that associated with an electro-magnetic field measurement using an induced current.

4. The system of claim 1, wherein the voltage detection device comprises a location sensor configured to acquire the location information associated with the voltage detection device.

5. The system of claim 4, wherein the location information comprises a latitude, a longitude, an accuracy, an altitude, a speed, and a direction.

6. The system of claim 4, wherein the location sensor comprises a global positioning system (GPS) sensor.

7. The system of claim 1, wherein the voltage detection device comprises a transmitter configured to transmit the location information to the receiver communicatively coupled to the control system.

8. The system of claim 1, wherein the voltage detection device is configured to output one or more warnings via one or more display outputs, one or more haptic outputs, and one or more audio outputs, or any combination thereof, wherein the one or more warnings are representative of the distance, an orientation of a user relative to the presence of the voltage detected by the voltage detection device, one or more preventive actions performed by the plurality of devices, and one or more recommendations for the user to implement to increase the distance, or any combination thereof.

9. A tangible, non-transitory computer-readable medium comprising computer-executable instructions that, when executed, are configured to cause at least one processor to perform operations comprising:
receiving location information from a voltage detection device, wherein the location information corresponds to a location of the voltage detection device that detected a presence of a voltage is within a distance;
identifying a first set of devices of a plurality of devices based on the location information, wherein the plurality of devices is configured to control power to a plurality of electrical components of an electrical power distribution system;
sending a first set of commands to the first set of devices, wherein the first set of commands is configured to adjust a first set of operations of the first set of devices to reduce the voltage; and
broadcasting the location information to a second set of devices of the plurality of devices after sending the first set of commands, wherein the second set of devices are within a communication range of the at least one processor, wherein the second set of devices are configured to adjust a second set of operations based on the location information, and wherein the second set of devices are located a threshold distance away from the first set of devices.

10. The non-transitory computer-readable medium of claim 9, wherein the computer-executable instructions, when executed, are configured to cause the at least one processor to change a time setting for an electrical component of the plurality of electrical components in response to the location information indicating that the voltage detection device is within the distance of the electrical component.

11. The non-transitory computer-readable medium of claim 9, wherein the computer-executable instructions, when executed, are configured to cause the at least one processor to receive additional location information associated with a plurality of additional voltage detection devices from the voltage detection device that is configured to couple to the plurality of additional voltage detection devices.

12. The non-transitory computer-readable medium of claim 9, wherein the computer-executable instructions, when executed, are configured to cause the at least one processor to perform the operations comprising:
transmitting the location information to a plurality of control systems, wherein one of the plurality of control systems is configured to adjust one or more settings of a device of the plurality of devices configured to control power output to an electrical line.

13. The non-transitory computer-readable medium of claim 9, wherein the computer-executable instructions, when executed, are configured to cause the at least one processor to send the location information to an additional control system.

14. The non-transitory computer-readable medium of claim 9, wherein the one or more operations comprise opening a circuit breaker to stop outputting power to an electrical line.

15. The non-transitory computer-readable medium of claim 9, wherein the computer-executable instructions, when executed, are configured to cause the at least one processor to perform the operations comprising adjusting the one or more operations comprise reducing one or more time settings associating with tripping a device of the plurality of devices.

16. A method, comprising:
receiving, via a processor, information indicative of a presence of a voltage greater than a threshold within a distance of a voltage detection device;
receiving, via the processor, location information associated with the voltage detection device from a receiver communicatively coupled to a power control system;
identifying a first set of devices of a plurality of devices based on the location information;
sending a first set of commands to the first set of devices, wherein the first set of commands is configured to adjust a first set of operations of the first set of devices to reduce the voltage; and
broadcasting the location information to a second set of devices of the plurality of devices after sending the first set of commands, wherein the second set of devices are within a communication range of the power control system, wherein the second set of devices is configured to adjust a second set of operations based on the location information, and wherein the second set of devices are located a threshold distance away from the first set of devices
generating, via the processor, one or more alerts associated with the presence of the voltage;
receiving, via the processor, power line status information from the power control system; and
presenting, via the processor, the one or more alerts and the power line status information via one or more visualizations depicted on a display, one or more haptic outputs, one or more audio outputs, or any combination thereof.

17. The method of claim 16, wherein the power line status information is indicative of a status of a power distribution system after one or more preventive actions have been performed in response to a detection of the voltage that is greater than the threshold.

18. The method of claim 16,
wherein the first set of commands to the first set of devices comprise adjusting one or more settings based on at least in part of the location information.

19. The method of claim 18, wherein the one or more settings comprise one or more time settings associate with one or more trip operations.

20. The method of claim 18, wherein the one or more settings comprise opening a circuit breaker.

* * * * *